US012622279B2

(12) United States Patent
Kim et al.

(10) Patent No.: US 12,622,279 B2
(45) Date of Patent: May 5, 2026

(54) PACKAGE WITH DUAL LAYER ROUTING INCLUDING GROUND RETURN PATH

(71) Applicant: TEXAS INSTRUMENTS INCORPORATED, Dallas, TX (US)

(72) Inventors: Woochan Kim, Sunnyvale, CA (US); Benjamin Allen Samples, San Jose, CA (US); Vivek Kishorechand Arora, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 839 days.

(21) Appl. No.: 16/222,920

(22) Filed: Dec. 17, 2018

(65) Prior Publication Data

US 2020/0194390 A1      Jun. 18, 2020

(51) Int. Cl.
H01L 23/495 (2006.01)
H01L 21/48 (2006.01)
(Continued)

(52) U.S. Cl.
CPC .......... H01L 23/66 (2013.01); H01L 21/4825 (2013.01); H01L 21/561 (2013.01);
(Continued)

(58) Field of Classification Search
CPC ......... H01L 23/49537; H01L 23/49575; H01L 23/49861; H01L 2224/16245–1626;
(Continued)

(56) References Cited

U.S. PATENT DOCUMENTS 5,008,776 A * 4/1991 Queyssac .......... H01L 23/49551
                                                                361/728
5,245,215 A * 9/1993 Sawaya ............... H01L 23/3107
                                                                257/676

(Continued)

FOREIGN PATENT DOCUMENTS

EP            1376747 A2     1/2004

OTHER PUBLICATIONS

AN-1281 Bumped Die (Flip Chip) Packages, Texas Instruments Incorporated, Dallas, Texas, 2012.

*Primary Examiner* — Ajay Ojha
*Assistant Examiner* — Tsz K Chiu
(74) *Attorney, Agent, or Firm* — Yudong Kim; Frank D. Cimino

(57) ABSTRACT

A package includes a first leadframe including a plurality of leads and a conductor, a first semiconductor die mounted on a first surface of the first leadframe and attached to a first subset of the plurality of leads and the conductor, and a second semiconductor die mounted on the first surface of the first leadframe and attached a second subset of the plurality of leads and the conductor. The conductor provides a direct electrical connection for an electrical signal between the first semiconductor die and the second semiconductor die. The package further includes a second leadframe. The first leadframe is mounted on the second leadframe via a second surface of the first leadframe, the second surface opposite the first surface. The second leadframe provides a ground return path between the between the first semiconductor die and the second semiconductor die for the electrical signal.

17 Claims, 9 Drawing Sheets

(51) Int. Cl.
| | |
|---|---|
| *H01L 21/56* | (2006.01) |
| *H01L 21/78* | (2006.01) |
| *H01L 23/31* | (2006.01) |
| *H01L 23/66* | (2006.01) |
| *H10D 62/85* | (2025.01) |

(52) U.S. Cl.
CPC ............. H01L 21/565 (2013.01); H01L 21/78 (2013.01); H01L 23/3135 (2013.01); H01L 23/4951 (2013.01); H01L 23/4952 (2013.01); H01L 23/49537 (2013.01); H01L 23/49562 (2013.01); H01L 23/49575 (2013.01); *H01L 2224/16245* (2013.01); *H01L 2224/16258* (2013.01); *H01L 2224/1626* (2013.01); *H10D 62/8503* (2025.01)

(58) Field of Classification Search
CPC ......... H01L 23/49541; H01L 23/49548; 23/49562; H01L 23/3107; H01L 23/49524; H01L 24/41; H01L 24/48; H01L 24/73; H01L 24/92; H01L 24/40; H01L 24/49; H01L 24/83; H01L 24/85; H01L 24/27; H01L 24/29; H01L 24/32; H01L 24/33; H01L 24/37; H01L 24/84; H01L 23/49503–49513; H01L 25/042; H01L 25/0655; H01L 25/072; H01L 25/0753; H01L 25/115; H01L 2224/2101; H01L 2224/214; H01L 2924/00014; H01L 2924/00012; H01L 2924/01082; H01L 2224/48247; H01L 2924/00; H01L 2924/181; H01L 2924/01079; H01L 2224/32245; H01L 2924/01029; H01L 2924/01033; H01L 2224/48091; H01L 2224/45015; H01L 2924/014; H01L 2224/0603; H01L 2224/40245; H01L 2224/73221; H01L 2224/97; H01L 2924/01013; H01L 2924/13091; H01L 2924/14; H01L 2224/73265; H01L 2924/01006; H01L 2924/207; H01L 21/4825; H01L 2224/37011; H01L 2224/40095; H01L 2224/40247; H01L 2224/4103; H01L 2224/83; H01L 2224/84; H01L 2224/8485; H01L 2224/92; H01L 2924/1306; H01L 2224/81; H01L 23/49517; H01L 24/97; H01L 2924/01047; H01L 21/565; H01L 2224/24101; H01L 2224/24137; H01L 2224/24245; H01L 2224/244; H01L 2224/245; H01L 2224/24991; H01L 2224/25175; H01L 2224/2919; H01L 2224/2929; H01L 2224/45099; H01L 2224/45144; H01L 2224/73267; H01L 2224/82009; H01L 2224/82103; H01L 2224/85; H01L 24/24; H01L 24/25; H01L 24/82; H01L 2924/01005; H01L 2924/01028; H01L 2924/0105; H01L 2924/013; H01L 2224/05554; H01L 23/4952; H01L 25/0657; H01L 2924/19105; H01L 2924/30107; H01L 2021/60292; H01L 21/4821; H01L 21/56; H01L 21/561; H01L 21/568; H01L 2224/05599; H01L 2224/11318; H01L 2224/13083; H01L 2224/27013; H01L 2224/29101; H01L 2224/37099; H01L 2224/371; H01L 2224/4007; H01L 2224/40249; H01L 2224/45014; H01L 2224/45124; H01L 2224/45147; H01L 2224/48257; H01L 2224/49171; H01L 2224/73263; H01L 2224/83801; H01L 2224/8385; H01L 2224/84345; H01L 2224/84801; H01L 23/293; H01L 23/3121; H01L 23/3135; H01L 24/38; H01L 24/81; H01L 2924/00015; H01L 2924/01046; H01L 2924/01067; H01L 2924/01078; H01L 2924/0665; H01L 2924/0781; H01L 2924/186; H01L 2924/206; H01L 2224/05553; H01L 2224/16145; H01L 2224/16225; H01L 2224/29099; H01L 2224/32225; H01L 2224/48101; H01L 2224/48105; H01L 2224/48137; H01L 2224/48177; H01L 2224/73207; H01L 2224/73253; H01L 2224/85399; H01L 2224/92247; H01L 2225/06562; H01L 23/3185; H01L 24/16; H01L 2924/15153; H01L 2924/19104; H01L 2924/19107; H01L 2924/3025; H01L 21/563; H01L 2224/05644; H01L 2224/291; H01L 2224/293; H01L 2224/48227; H01L 2224/48465; H01L 2224/48644; H01L 2224/49175; H01L 2224/49433; H01L 2225/0651; H01L 2225/06558; H01L 23/3142; H01L 23/481; H01L 23/4951; H01L 23/49531; H01L 23/49589; H01L 23/49822; H01L 23/60; H01L 23/64; H01L 24/06; H01L 24/09; H01L 24/45; H01L 25/0652; H01L 25/50; H01L 2924/01023; H01L 2924/01027; H01L 2924/10161; H01L 2924/10272; H01L 2924/15311; H01L 2924/19041; H01L 2924/20752; H01L 2924/30105; H01L 2924/3011; H01L 2223/54486; H01L 2224/274; H01L 2224/32145; H01L 2224/48228; H01L 2224/4911; H01L 2224/83191; H01L 2224/83856; H01L 23/3128; H01L 23/49551; H01L 23/49558; H01L 23/544; H01L 23/552; H01L 2924/01074; H01L 2924/01075; H01L 2924/07802; H01L 2924/12041; H01L 2924/15747; H01L 2924/18301

See application file for complete search history.

(56) References Cited

U.S. PATENT DOCUMENTS

| | | | | |
|---|---|---|---|---|
| 5,592,130 | A * | 1/1997 | Ikeda | H03B 5/36 |
| | | | | 29/25.35 |
| 5,663,597 | A | 9/1997 | Nelson et al. | |
| 6,239,367 | B1 * | 5/2001 | Hsuan | H01L 23/49572 |
| | | | | 174/254 |
| 6,384,472 | B1 * | 5/2002 | Huang | H01L 21/50 |
| | | | | 257/730 |
| 6,396,136 | B2 | 5/2002 | Kalidas et al. | |
| 6,492,726 | B1 * | 12/2002 | Quek | H01L 23/055 |
| | | | | 257/723 |
| 6,831,352 | B1 * | 12/2004 | Tsai | H01L 23/49575 |
| | | | | 257/676 |
| 6,917,097 | B2 * | 7/2005 | Chow | H01L 23/3107 |
| | | | | 257/666 |
| 7,135,759 | B2 | 11/2006 | Efland et al. | |
| 7,598,605 | B2 * | 10/2009 | Akiyama | H01L 23/49575 |
| | | | | 257/532 |
| 7,838,340 | B2 | 11/2010 | Cruz et al. | |
| 8,299,588 | B1 | 10/2012 | Tateishi et al. | |

(56) References Cited

U.S. PATENT DOCUMENTS

| | | | |
|---|---|---|---|
| 8,354,303 B2 | 1/2013 | Lopez et al. | |
| 8,357,564 B2 * | 1/2013 | Chi | H01L 23/49527 |
| | | | 438/108 |
| 8,450,149 B2 | 5/2013 | Bayan et al. | |
| 8,822,273 B2 | 9/2014 | Kuo et al. | |
| 8,884,414 B2 | 11/2014 | Lee et al. | |
| 8,946,880 B2 | 2/2015 | Saye | |
| 9,029,990 B2 * | 5/2015 | Lee | H01L 25/50 |
| | | | 257/666 |
| 9,177,945 B2 | 11/2015 | Saye | |
| 9,209,119 B1 * | 12/2015 | Wang | H01L 23/3114 |
| RE46,466 E | 7/2017 | Lange et al. | |
| 9,768,145 B2 * | 9/2017 | Yu | H01L 24/03 |
| 10,115,651 B2 * | 10/2018 | Nishimura | H01L 23/5389 |
| 10,998,272 B2 * | 5/2021 | Aleksov | H01L 23/49816 |
| 11,133,263 B2 * | 9/2021 | Strong | H01L 23/3128 |
| 2005/0116322 A1 * | 6/2005 | Sando | H01L 23/49537 |
| | | | 257/676 |
| 2006/0017141 A1 * | 1/2006 | Luo | H01L 23/49562 |
| | | | 257/E23.044 |
| 2006/0099742 A1 * | 5/2006 | Hochstenbach | H01L 23/3107 |
| | | | 438/127 |
| 2008/0315380 A1 * | 12/2008 | Tay | H01L 24/83 |
| | | | 257/676 |
| 2009/0014854 A1 * | 1/2009 | Cho | H01L 23/49537 |
| | | | 257/676 |
| 2009/0057857 A1 * | 3/2009 | Kaneda | H01L 23/49575 |
| | | | 257/676 |
| 2010/0289095 A1 * | 11/2010 | Poeppel | H01L 24/97 |
| | | | 257/E21.597 |
| 2011/0089546 A1 * | 4/2011 | Bayan | H01L 23/495 |
| | | | 257/676 |
| 2011/0101542 A1 * | 5/2011 | Camacho | H01L 24/16 |
| | | | 257/778 |
| 2011/0278707 A1 * | 11/2011 | Chi | H01L 24/97 |
| | | | 257/676 |
| 2012/0025361 A1 * | 2/2012 | Ito | H01L 23/49861 |
| | | | 257/676 |
| 2012/0241915 A1 * | 9/2012 | Bathan | H01L 23/49575 |
| | | | 257/621 |
| 2012/0313229 A1 * | 12/2012 | Lee | H01L 23/552 |
| | | | 257/675 |
| 2013/0049183 A1 * | 2/2013 | Yao | H01L 23/4334 |
| | | | 257/676 |
| 2013/0065361 A1 * | 3/2013 | Shen | H01L 23/49861 |
| | | | 438/113 |
| 2013/0127029 A1 | 5/2013 | Lee et al. | |
| 2015/0155217 A1 * | 6/2015 | Kim | H01L 23/49568 |
| | | | 438/122 |
| 2015/0200162 A1 * | 7/2015 | Constantino | H01L 23/49541 |
| | | | 257/532 |
| 2015/0221584 A1 * | 8/2015 | Lopez | H01L 24/40 |
| | | | 257/676 |
| 2015/0255443 A1 * | 9/2015 | Xu | H01L 24/29 |
| | | | 438/118 |
| 2016/0172279 A1 | 6/2016 | Cho | |
| 2016/0276185 A1 * | 9/2016 | Samson | H01L 24/97 |
| 2017/0062383 A1 * | 3/2017 | Yee | H01L 23/3675 |
| 2017/0125324 A1 | 5/2017 | Joshi et al. | |
| 2017/0213781 A1 * | 7/2017 | Lee | H01L 23/49537 |
| 2018/0090419 A1 * | 3/2018 | Ho | H01L 23/49551 |
| 2019/0013288 A1 * | 1/2019 | Kim | H01L 23/4334 |
| 2020/0099365 A1 * | 3/2020 | Choy | H03H 9/1014 |

* cited by examiner

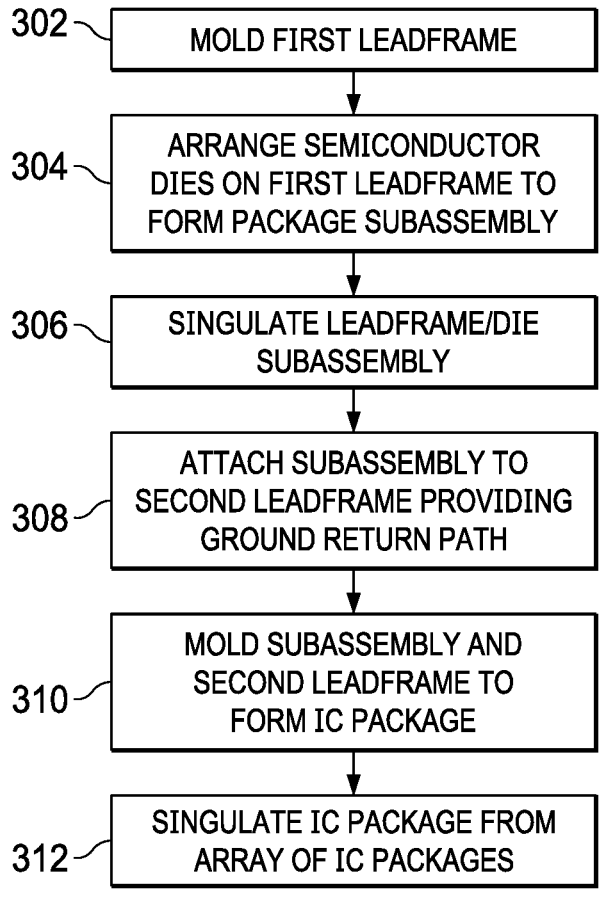

302 — MOLD FIRST LEADFRAME

304 — ARRANGE SEMICONDUCTOR DIES ON FIRST LEADFRAME TO FORM PACKAGE SUBASSEMBLY

306 — SINGULATE LEADFRAME/DIE SUBASSEMBLY

308 — ATTACH SUBASSEMBLY TO SECOND LEADFRAME PROVIDING GROUND RETURN PATH

310 — MOLD SUBASSEMBLY AND SECOND LEADFRAME TO FORM IC PACKAGE

312 — SINGULATE IC PACKAGE FROM ARRAY OF IC PACKAGES

FIG. 4

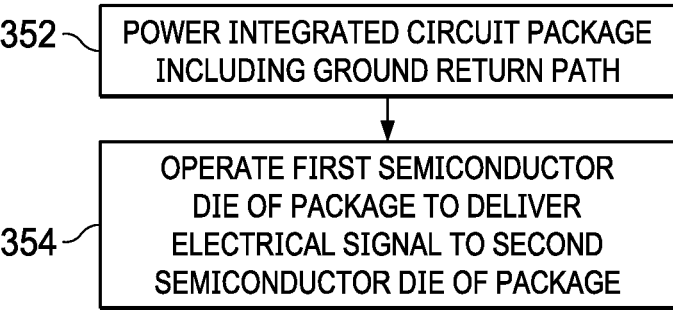

352 — POWER INTEGRATED CIRCUIT PACKAGE INCLUDING GROUND RETURN PATH

354 — OPERATE FIRST SEMICONDUCTOR DIE OF PACKAGE TO DELIVER ELECTRICAL SIGNAL TO SECOND SEMICONDUCTOR DIE OF PACKAGE

FIG. 5

PACKAGE WITH DUAL LAYER ROUTING INCLUDING GROUND RETURN PATH

TECHNICAL FIELD

This disclosure relates to integrated circuit packages.

BACKGROUND

An electrical signal between two semiconductor dies of the semiconductor package may be carried on one or more conductors of the package, such as leadframe conductors. In addition, return current of the electrical signal can traverse the ground terminals of the semiconductor dies to the ground reference plane of the circuit the semiconductor package is connected to, such as a printed circuit board. The path of the current loop of the electrical includes the package conductor carrying the electrical signal between the semiconductor dies, as well as the semiconductor dies' ground terminals and the ground reference plane of the printed board carrying the return current. This current loop path provides an impedance associated with the electrical signal.

BRIEF SUMMARY

This disclosure includes techniques for integrated circuit (IC) packages that provide a ground return path within the package for electronic signals between semiconductor dies in the package. The disclosed techniques may allow a lower impedance of a signal loop for electronic signals between the dies as compared to IC packages that rely on the ground plane of the underlying circuit. Reducing the impedance of the signal path may mitigate voltage overshoot of the electronic signals between semiconductor dies, thereby facilitating higher frequency communications between the semiconductor dies, as voltage overshoot can interfere with signal transmission.

In one example, a package includes a first leadframe including a plurality of leads and a conductor, a first semiconductor die mounted on a first surface of the first leadframe and attached to a first subset of the plurality of leads and the conductor, and a second semiconductor die mounted on the first surface of the first leadframe and attached a second subset of the plurality of leads and the conductor. The conductor provides a direct electrical connection for an electrical signal between the first semiconductor die and the second semiconductor die. The package further includes a second leadframe. The first leadframe is mounted on the second leadframe via a second surface of the first leadframe, the second surface opposite the first surface. The second leadframe provides a ground return path between the between the first semiconductor die and the second semiconductor die for the electrical signal.

In another example, a method of forming a package includes arranging a first semiconductor die on a first surface of a first leadframe, arranging a second semiconductor die on the first surface of the first leadframe. The first leadframe provides a direct electrical connection for an electrical signal between the first semiconductor die and the second semiconductor die. The method further includes attaching the first leadframe with the first semiconductor die and the second semiconductor die to a second leadframe. The second leadframe provides a ground return path between the between the first semiconductor die and the second semiconductor die for the electrical signal.

In another example, a package includes a first leadframe including a plurality of leads, a first gallium nitride die mounted on a first surface of the first leadframe and attached to a first subset of the plurality of leads and a conductor, a second gallium nitride die mounted on the first surface of the first leadframe and attached to a second subset of the plurality of leads and the conductor. The conductor provides a direct electrical connection for an electrical signal between the first gallium nitride die and the second gallium nitride die. The package further includes a second leadframe. The first leadframe is mounted on the second leadframe via a second surface of the first leadframe, the second surface opposite the first surface. The second leadframe provides a ground return path between the between the first gallium nitride die and the second gallium nitride die for the electrical signal.

BRIEF DESCRIPTION OF THE DRAWINGS

FIG. 4 is a flowchart of a method of manufacturing a semiconductor package providing a ground return path within the package.

FIG. 5 is a flowchart of a method of operating a semiconductor package providing a ground return path within the package.

DETAILED DESCRIPTION

IC packages provide a ground return path with the package, facilitating a low impedance for a signal loop for electrical signal signals between semiconductor dies of the package. In some particular examples, the disclosed packages may include dies mounted on a first leadframe providing a conductive path between the dies. In turn, the first leadframe may be mounted on a second leadframe of the package, the second leadframe providing a ground return path for an electrical signal traversing the conductive path between the dies. In this manner, the signal loop is contained within the package, which facilitates a lower impedance than with alternative designs in which the ground return path of the signal loop travels outside the package, such as through the ground plane of a printed circuit board (PCB) or the like on which an IC package is mounted.

Reducing the impedance of the signal loop may mitigate voltage overshoot of the electronic signals between semiconductor dies, thereby facilitating higher frequency communications between the semiconductor dies. The disclosed techniques are applicable to any semiconductor dies, and may be particularly useful higher frequency transmissions, such as gallium nitride (GaN) dies. For example, GaN architecture, such as or GaN-on-silicon or GaN-on-silicon carbide, have been demonstrated as supporting higher frequencies as compared to silicon architecture or gallium arsenide architecture.

The disclosed techniques may apply to a variety of IC packages, including small outline packages (SOP) in which leads protrude from opposite sides of the encapsulated portion of the package, as well as quad flat packages (QFP). In QFP, the leads protrude outwardly from four lateral sides of the encapsulated portion of the package. The protruding leads in, for example, a gull wing type SOP, may be bent into an appropriate shape after the IC package has been severed from a leadframe strip including an array of leadframes interconnected with tie bars. Such IC packages are often used in surface mount technology (SMT) in which the leads extending from the sides of the package are soldered to surface contact portions of a PCB or the like. IC package 100 is one example of a gull wing type SOP that provides a ground return path with the package.

Figure 1A:
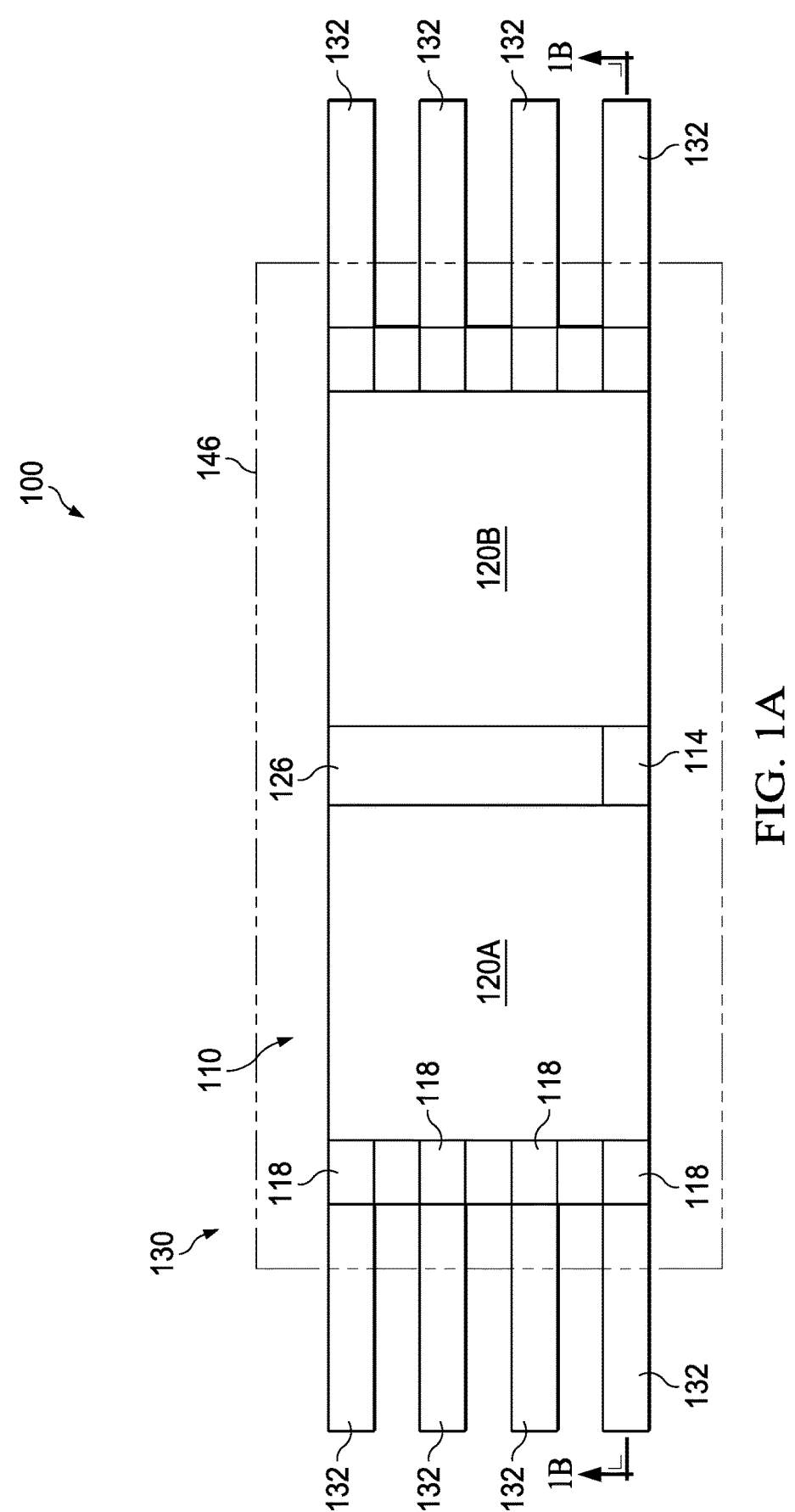
FIG. 1A is a conceptual drawing showing a top view of a semiconductor package providing a ground return path within the package.

FIGS. 1A-2D are conceptual drawings of IC package 100 and its components. In particular, FIG. 1A is a conceptual drawing showing a top view of IC package 100, while FIG. 1B is a conceptual drawing showing a cut-away side view of IC package 100. FIGS. 2A-2D are conceptual drawings showing top views of components of the semiconductor package of FIG. 1A.

IC package 100 provides a ground return path within the package for electronic signals between semiconductor dies 120A and 120B (collectively, "dies 120"). In particular examples, dies 120 may include GaN architecture, thereby representing GaN dies. Semiconductor dies 120 are mounted on leadframe 110, and leadframe 110 is mounted on leadframe 130, which provides the ground return path for the electronic signals between semiconductor dies 120.

Leadframe 110 includes leads 112 and conductor 114 with bonding pads 118. Die attach sites 119A, 119B (collectively, "sites 119") represent the contact areas for physical and electrical connection to dies 120. In the example of leadframe 110, die attach sites 119 are formed by bonding pads 118 of leads 112 and conductor 114. In other examples, die attach sites 119 may further include a central pad surrounded by leads including bonding pads. Such a central pad may provide additional area for fixation of dies 120 to a leadframe.

Leadframes, such as leadframes 110, 130, are formed on a single, thin sheet of metal as by stamping or etching. Multiple interconnected leadframes may be formed on a single leadframe sheet, the interconnected leadframes referred to as a leadframe strip. Leadframes on the sheet can be arranged in rows and columns. Tie bars connect leads and other elements of a leadframe to one another as well as to elements of adjacent leadframes in a leadframe strip. A siderail may surround the array of leadframes to provide rigidity and support leadframe elements on the perimeter of the leadframe strip. The siderail may also include alignment features to aid in manufacturing.

Usually die mounting, die to lead attachment (e.g. wire bonding) and molding to cover at least part of the leadframe and dies take place while the leadframes are still integrally connected as a leadframe strip. After such processes are completed, the leadframes, and sometimes mold compound of a package, are severed ("singulated" or "diced") with a cutting tool, such as a saw or laser. These singulation cuts separate the leadframe strip into separate IC packages, each IC package including a singulated leadframe, at least one die, electrical connections between the die and leadframe (such as gold or copper bond wires) and the mold compound which covers at least part of these structures.

Tie bars and the siderail may be removed during singulation of the packages. However, in IC package 100, leadframe 110 is part of a subassembly 102 (FIG. 2B), including mold compound 126 and dies 120, that is singulated prior to its incorporation into IC package 100. In contrast, leadframe 130 may be connected to adjacent leadframes via tie bars, and optional siderails in an array of packages manufactured together of until singulation of an array of packages including IC package 100. For both leadframe 110 and leadframe 130, the term leadframe of represents the portions of the leadframe strip remaining within a package after singulation. With respect to IC package 100, leadframe 110 includes leads 112 and conductor 114 although those elements are not interconnected following singulation of subassembly 102. Likewise, leadframe 130 includes leads 132 and ground return conductor 134 although those elements are not interconnected following singulation of IC package 100.

Within subassembly 102, leads 112 and conductor 114 are separated by mold compound 126. In the example of subassembly 102, mold compound 126 is flush with a first surface of leadframe 110, leaving bonding pads 118 of leads 112 and conductor 114 exposed to facilitate connections with dies 120. Mold compound 126 is also flush with an opposing second surface of leadframe 110, leaving portions of leads 112 exposed to facilitate electrical connections with leadframe 130.

Dies 120 are attached to the first surface of leadframe 110 at their respective die attach sites 119. Die 120A is attached to a first subset of leads 112 and conductor 114 at die attach site 119A, and die 120B is attached to a second subset of leads 112 and conductor 114 at die attach site 119B. Each of leads 112 is uniquely associated with exactly one of dies 120. In other examples, some leads 112 may extend to more than one die attach site for connection to more than one die. For example, leads providing electrical power connections or other universal signals may extend to more than one die.

Figure 2A:
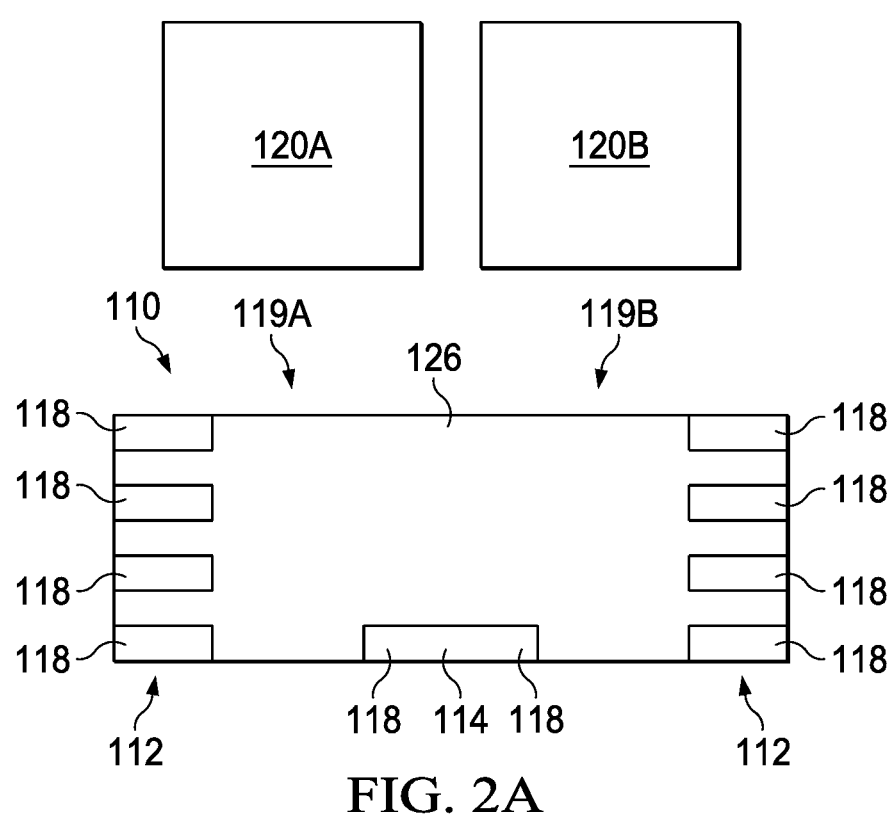
FIGS. 2A-2D are conceptual drawings showing top views of components of the semiconductor package of FIG. 1A.
Figure 2B:
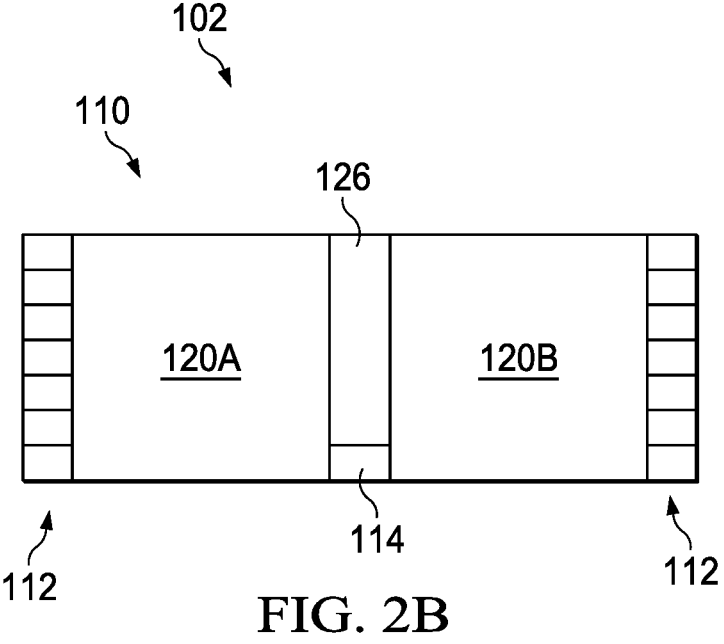

As shown in FIG. 2A, semiconductor dies 120 are mounted to die attach sites 119 to form subassembly 102 (FIG. 2B). Leads 112 extend from both opposite sides of leadframe 110, although other configurations are contemplated, including configurations with leads extending from four sides of leadframe 110. Within subassembly 102, leads 112 and conductor 114 are supported by mold compound 126 to facilitate mounting subassembly 102 on leadframe 130. In the specific example of IC package 100, mold compound 126 covers portions of leadframe 110, but not semiconductor dies 120 or leadframe 130. The combined rigidity of leadframe 110 and mold compound 126 within subassembly 102 facilitates mounting subassembly 102 on leadframe 130.

In alternative examples, leadframe 110 may be designed to be sufficiently rigid to allow mounting subassembly 102 on leadframe 130 without the support of mold compound 126. In such examples, leads and conductors of leadframe 110 may be produced from relatively thick substrate with relatively wide conductors. In the alternative example of a subassembly without mold compound 126, leads 112 and conductor 114 could be held together through attachment to dies 120. Such a subassembly would be further supported following molding of the assembled electronic components of the package.

Within subassembly 102, semiconductor die 120A is mounted on die attach site 119A (FIG. 2A) with die attach paste 124 and a set of solder bumps 122 to form a first flipchip arrangement. Likewise, semiconductor die 120B is mounted on die attach site 119B (FIG. 2A) with additional die attach paste 124 and another set of solder bumps 122 to form a second flipchip arrangement. Solder bumps 122 may be preattached to electrical contacts of semiconductor dies 120 and reflowed after positioning semiconductor dies 120 in alignment with die attach sites 119 to form electrical connections therebetween. While semiconductor dies 120 each form flipchip arrangements on leadframe 110 in IC package 100, other techniques for mounting semiconductor dies 120 to leadframe 110, such as wire bonding, may also be used either in combination with or as an alternative to the flipchip arrangements of semiconductor dies 120.

Within subassembly 102, conductor 114 provides a direct electrical connection for electrical signals between semiconductor dies 120. While IC package 100 includes only a single conductor 114 providing a direct electrical connection between semiconductor dies 120, other examples may include additional conductors providing additional connections between semiconductor dies 120. Such additional conductors may facilitate additional common connections using a ground for the return path of the signals and/or differential pair connections between dies 120. In addition, while IC package 100 includes exactly two die attach sites 119, corresponding to two semiconductor dies 120, the techniques disclosed herein apply to integrated circuits with any number of die attach sites and semiconductor dies.

Figure 2C:
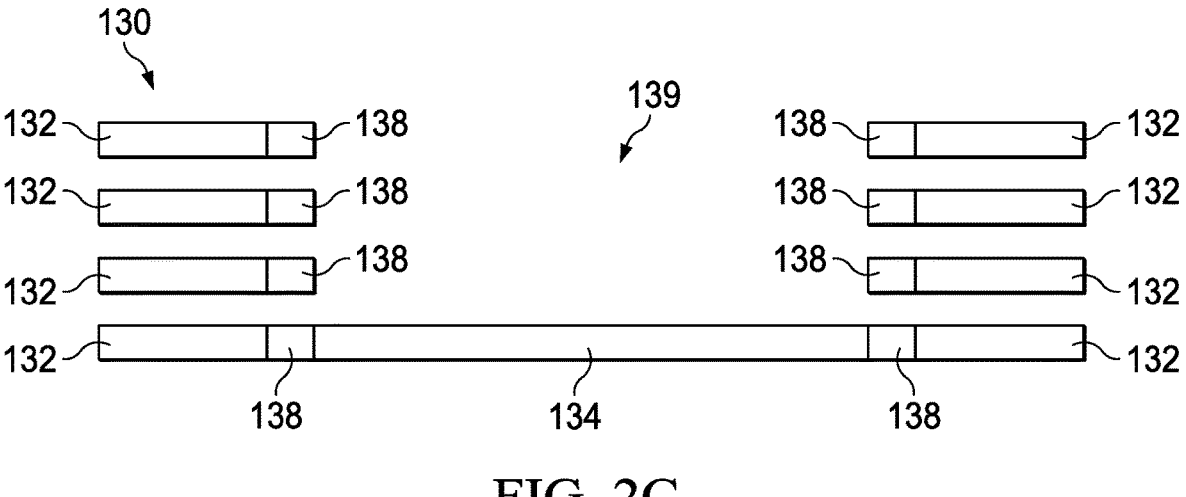

IC package 100 further includes a second leadframe, leadframe 130 (FIG. 2C). Leadframe 130 includes leads 132 with bonding pads 138. Leadframe attach site 139 represents the contact areas for physical and electrical connection to leadframe 110. In the example of leadframe 130, leadframe attach site 139 are formed by bonding pads 138 of leads 132 and ground return conductor 134. Leads 132 provide electrical connections to components external to IC package 100, via mounting on a PCB or the like. Leads 132 extend from both opposite sides of leadframe 130, although other configurations are contemplated, including configurations with leads extending from four sides of leadframe 130. In addition, leadframe 130 further includes ground return conductor 134, which forms part of a ground return path for electronic signals between semiconductor dies 120.

Figure 2D:
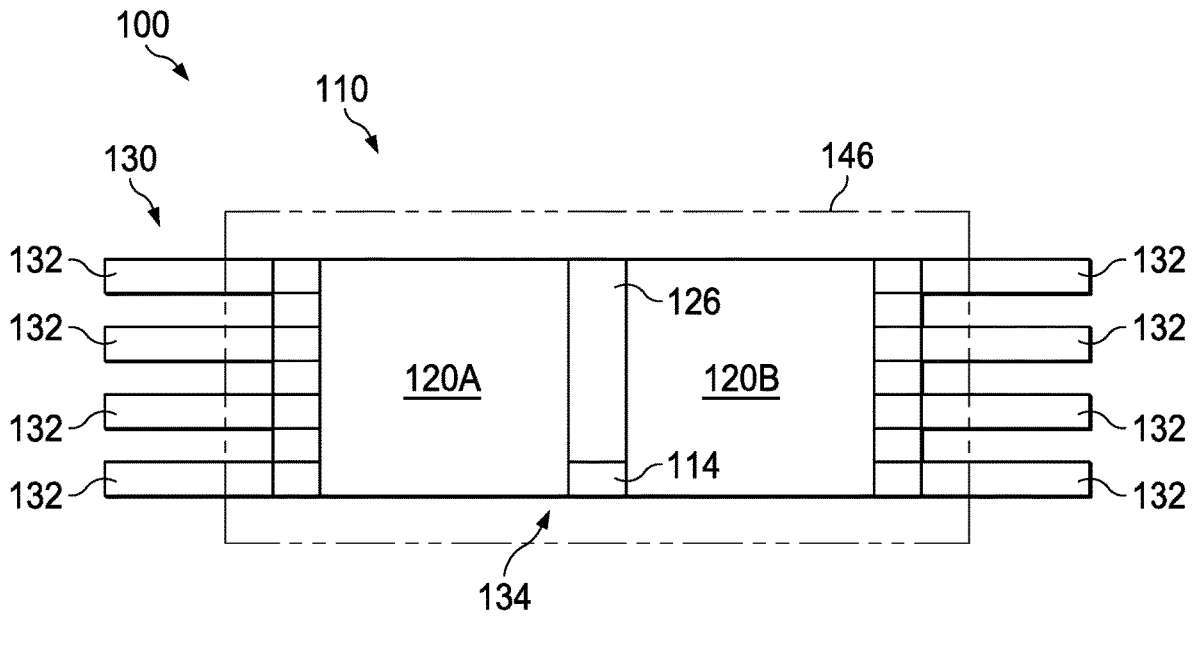

Subassembly 102, with leadframe 110 and semiconductor dies 120, is mounted to leadframe 130 within IC package 100 in a stacked arrangement to form a third flipchip arrangement (FIG. 2D). In this third flipchip arrangement, leads 112 are electrically connected to leads 132 with solder bumps 142. Leadframe 110 forms die attach sites 119 on a first surface of leadframe 110, adjacent to semiconductor dies 120. In turn, leadframe 110 is mounted to leadframe attach site 139 of leadframe 130 via a second surface of leadframe 110 opposite die attach sites 119. In some examples, leadframe 130 may further include a central pad surrounded by leads 132. In examples in which leadframe 130 includes a central pad, securing subassembly 102 to leadframe 130 may then include securing subassembly 102 to the central pad with nonconductive die attach.

In the example of IC package 100, leads 132 of leadframe 130 form a recess 133 (FIG. 1B) including leadframe attach site 139. Recess 133 is of sufficient depth such that leadframe 110 and dies 120 are all recessed relative to portions of leadframe 130 surrounding recess 133. Mold compound 146 is within recess 133 to cover subassembly 102, including leadframe 110, dies 120 and mold compound 126. Mold compound 146 also fills a space between leadframe 110 and leadframe 130. Although mold compound 146 partially covers leadframe 130, mold compound 146 is flush with the surface of leadframe 130 opposite subassembly 102 such that this surface is exposed on a package surface of IC package 100. In other examples, mold compound 146 may cover both sides of leadframe 130 while leaving electrical contact areas proximate the distal ends of leads 132 exposed. In the specific configuration of IC package 100, the distal ends of leads 132 extend beyond mold compound 146. Other configurations for leadframe 130 and leads 132 is also possible. As one alternative example, the distal ends of leads 132 may instead be flush with the surface of mold compound 146, e.g., in a flat no leads configuration such as QFP.

Figure 1B:
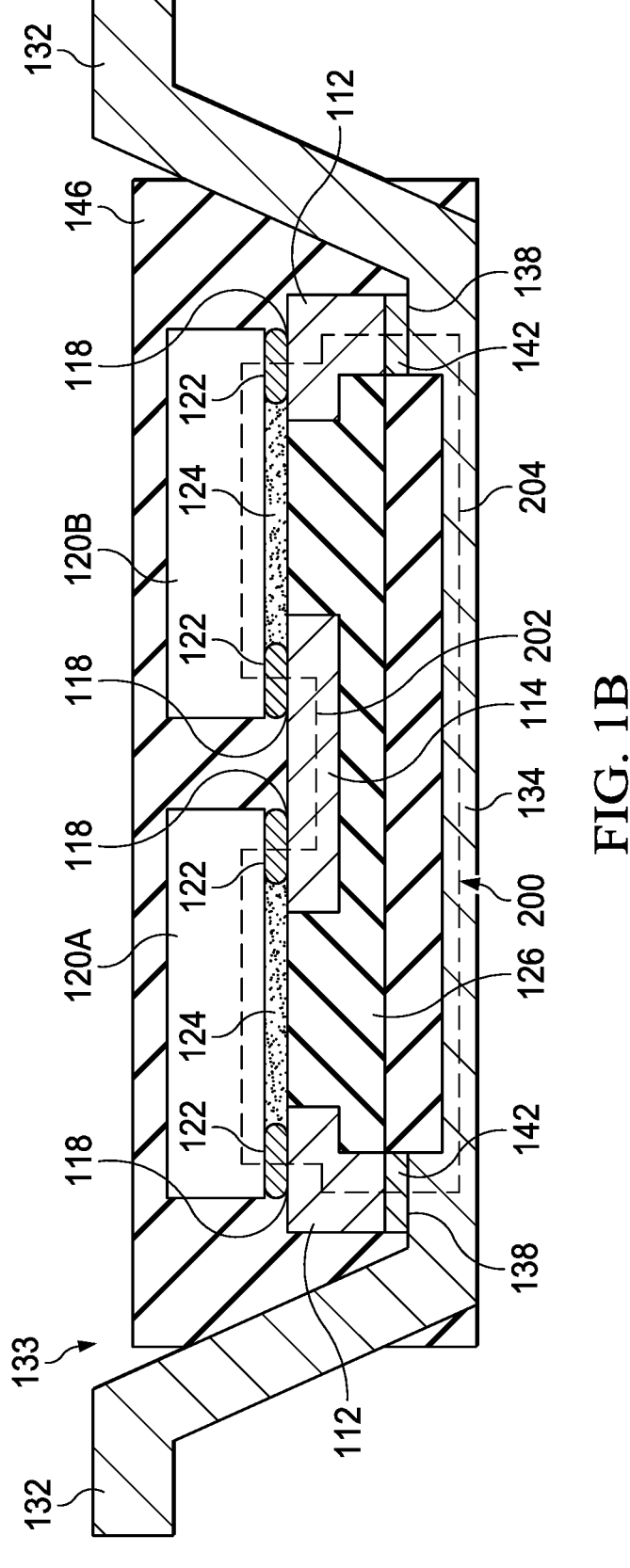
FIG. 1B is a conceptual drawing showing a cut-away side view of the semiconductor package of FIG. 1A.

As mentioned previously, leadframe 130 provides a ground return path for electronic signals between semiconductor dies 120. With reference to FIG. 1B, signal loop 200 for electronic signals traverses two layers between semiconductor dies 120 provided by leadframe 110 and leadframe 130. Specifically, signal loop 200 includes the electrical signal 202 on conductor 114 of leadframe 110, as well as ground return path 204, including ground return conductor 134 on leadframe 130. Ground return path 204 also includes the leads 112 associated with ground contacts of semiconductor dies 120, as well as ground return conductor 134. In this manner, signal loop 200 for electronic signals 202 between semiconductor dies 120 is entirely within package 100 and does not require an outside component, such as a ground plane of a PCB, or the like, on which package 100 is mounted.

Even though signal loop 200 is entirely within package 100, a portion of the ground return signal may still follow the ground plane of the associated PCB due to the parallel arrangement of ground return conductor 134 and the ground plane of the associated PCB. While the portion of the ground return signal following the ground plane of the associated PCB will depend on the overall design of the PCB and IC package 100, the direct path provided by ground return conductor 134 will allow for ground return conductor 134 to carry a majority of the ground return current as compared to the associated PCB. In some examples, ground return conductor 134 may include only a single point of contact with the associated PCB such that the PCB would not provide a parallel path for the ground return signal.

The impedance of signal loop 200 is related to the geometric area inside signal loop 200. By locating ground return path 204 within package 100, the geometric area inside signal loop 200 can be reduced. In addition, in the specific example of package 100, the geometric area inside signal loop 200 is further limited because conductor 114 overlaps ground return conductor 134 in the stacked arrangement of leadframe 110 and leadframe 130. In this manner, the route for electrical signal 202 on conductor 114 overlaps the route of ground return path 204 on ground return conductor 134. This overlapped arrangement limits the distance between electrical signal 202 and ground return path 204 to the separation distance of leadframe 110 and leadframe 130 in the stacked arrangement.

The designed path for signal loop 200 in package 100 facilitates a lower impedance for signal loop 200 as compared to IC packages that rely on the ground plane of the underlying circuit for the ground return path. A lower impedance for the signal path may mitigate voltage overshoot of the electronic signals between semiconductor dies, thereby facilitating higher frequency communications between the semiconductor dies, as voltage overshoot can interfere with signal transmission as higher frequencies.

While package 100 may include any semiconductor die architecture, its low signal loop impedance may be particularly useful for semiconductor dies 120 utilizing higher frequency transmissions. For example, one or both of semiconductor dies 120 may include GaN architecture, such as or GaN-on-silicon or GaN-on-silicon carbide. In the same or different examples, one or both of semiconductor dies 120 may include silicon architecture and/or gallium arsenide architecture.

While mold compound 126 forms a mold covering only portions of leadframe 110 within subassembly 102, mold compound 146 forms an overmold that covers subassembly 102, including mold compound 126, dies 120, and leadframe 110. Mold compound 146 also fills voids between subassembly 102 and leadframe 130. In other examples, all or a portion of this space may be filled with nonconductive die attach. In this manner, mold compound 146 provides a protective outer layer for the electric components of package 100.

FIGS. 3A-3F are conceptual drawings showing example manufacturing steps to form IC package 100. For brevity, elements of IC package 100 described with respect to FIGS. 1A-2D are either omitted or described in limited detail with respect to FIGS. 3A-3F. In addition, FIG. 4 is a flowchart of a method of manufacturing a semiconductor package providing a ground return path within the package. For clarity, the techniques of FIG. 4 are described with respect to leadframe 110 and FIGS. 3A-3F.

Figures 3A, 3B:
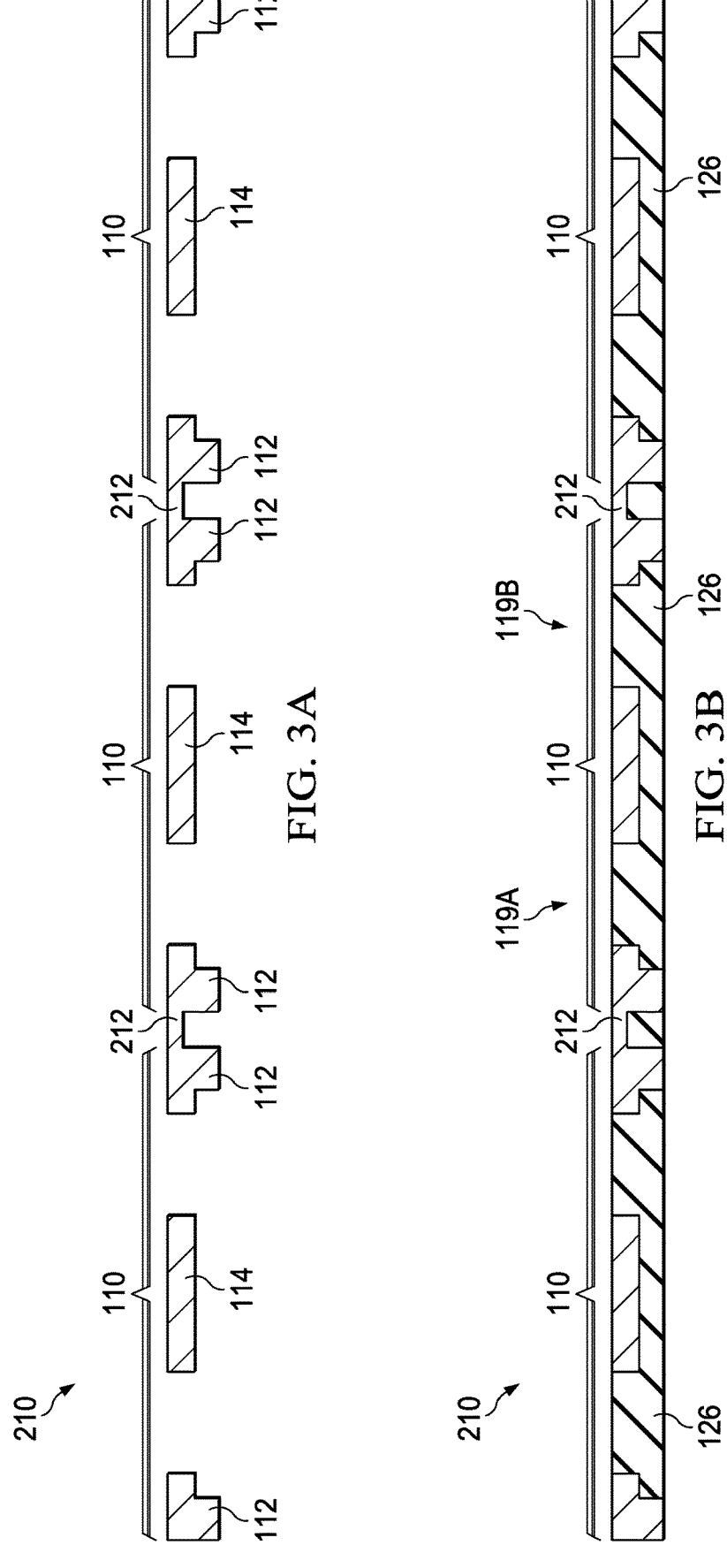
FIGS. 3A-3F are conceptual drawings showing example manufacturing steps to form the semiconductor package of FIG. 1A.

FIG. 3A illustrates a leadframe strip 210 including three leadframes 110 interconnected with tie bars 212. While only three leadframes 110 are shown in the conceptual drawing, generally leadframe strip 210 would include an array of leadframes 110 arranged in rows and columns. As shown in FIG. 3B, leadframe strip 210 is covered with mold compound 126 such that the mold compound is generally flush with opposing surfaces of leadframe strip 210, for example, using a transfer molding process (step 302). Mold compound 126 provides rigidity to the structure of leadframe strip 210 and leadframes 110, including tie bars 212, leads 112 and conductors 114. Bonding pads 118 of leads 112 and conductor 114 remain exposed to provide die attach sites 119 (FIG. 2A).

Figure 3C:
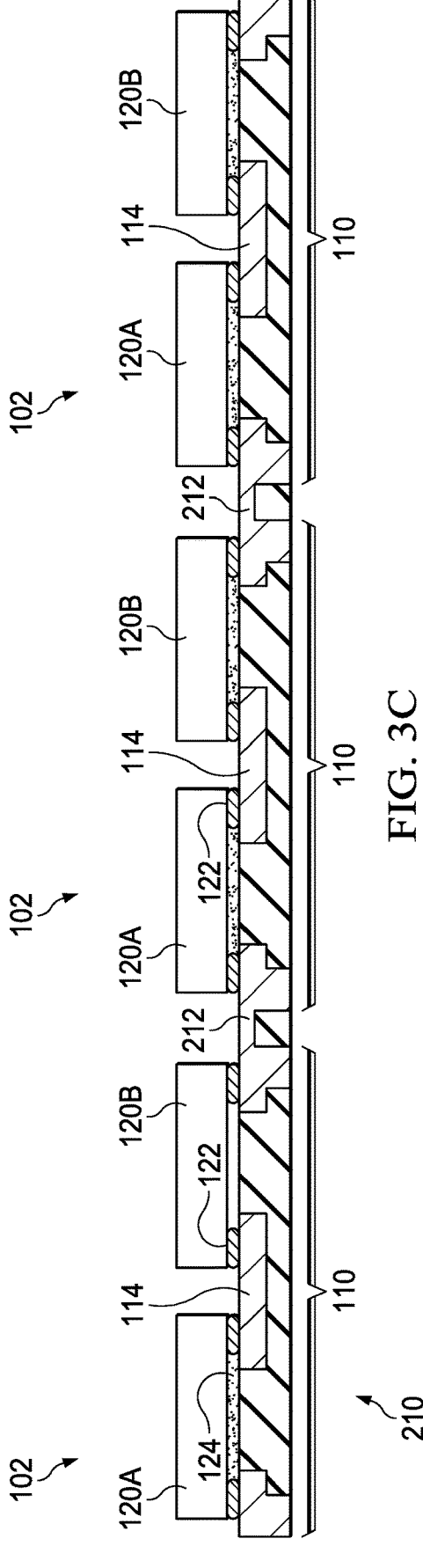

As shown in FIG. 3C, semiconductor dies 120 are arranged on die attach sites 119 of the molded leadframes 110. Semiconductor dies 120 are mounted to die attach sites 119 to form an array of subassemblies 102 (step 304). In some examples, semiconductor dies 120 are mounted to die attach sites 119 in flipchip arrangements. In each subassembly 102, such flipchip mounting may include reflowing solder bumps 122 on electrical contacts of semiconductor dies 120 to form electrical connections between semiconductor dies 120 and leadframe 110. Following the solder reflow, die attach paste 124 or other underfill is applied and cured to secure semiconductor dies 120 in place on each of the array of molded leadframes 110.

Figure 3D:
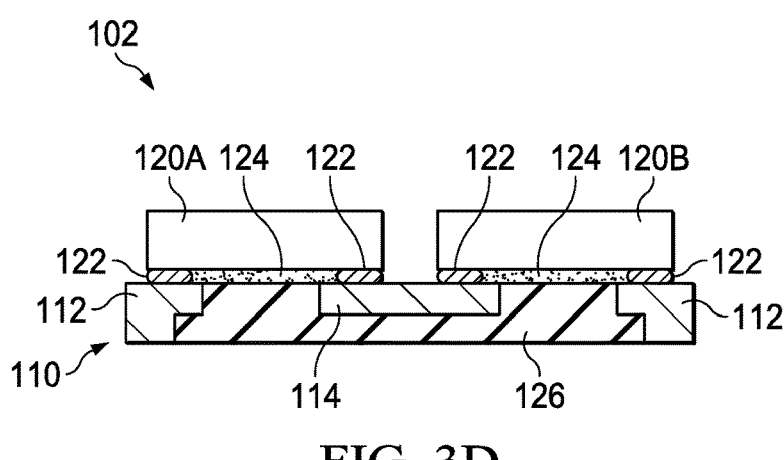

As represented by FIG. 3D, the array of subassemblies 102 is singulated prior to attaching each leadframe 110 to a leadframe 130. Singulation may include, for example, by cutting through tie bars 212 and mold material 126 in proximity to tie bars 212 with a saw or other cutting implement (step 306).

Figure 3E:
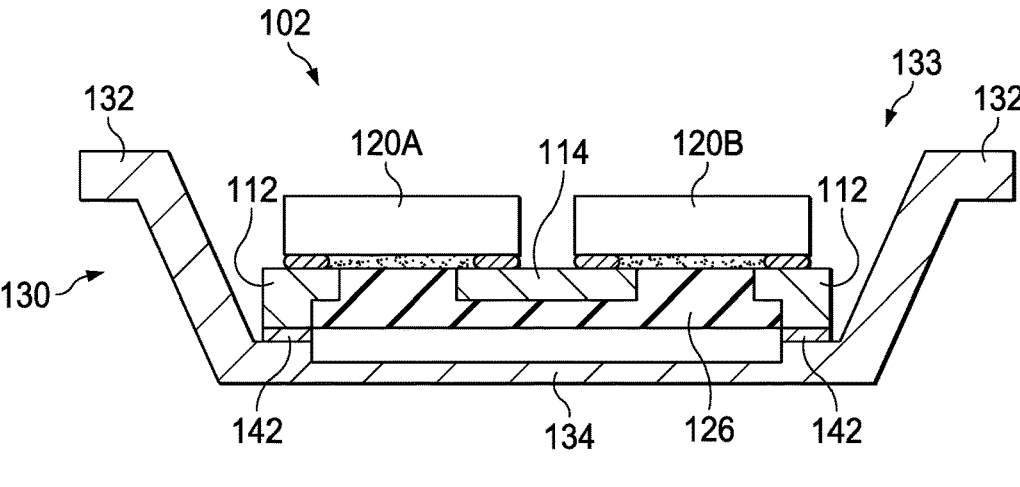

As represented by FIG. 3E, for each package 100, a singulated subassembly 102 is attached to leadframe attach site 139 of leadframe 130 such that leadframe 110 is in a stacked arrangement with leadframe 130 (step 308). In the stacked arrangement, ground return conductor 134 provides a ground return path for electrical signals between dies 120 of package 100. In some examples, subassembly 102 is mounted to leadframe attach site 139 in a flipchip arrangement. In each package 100, such flipchip mounting may include reflowing solder bumps 142 on electrical contacts of subassembly 102 to form electrical connections between leadframe 110 and leadframe 130. Following the solder reflow, die attach paste or other underfill may be optionally applied and cured to secure subassembly 102 in place on leadframe attach site 139 of leadframe 130.

Figure 3F:
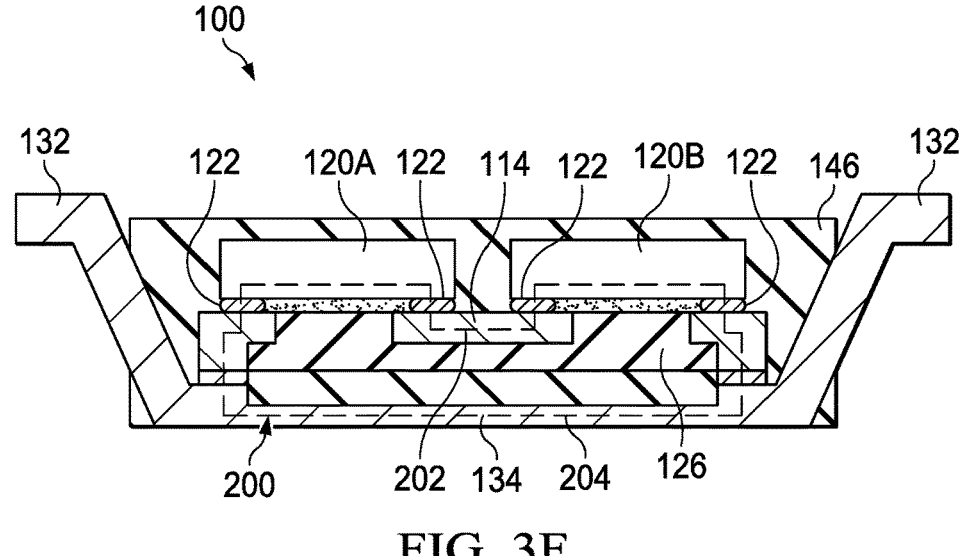

As shown in FIG. 3F, a second mold of mold compound 146 is formed to encapsulate subassembly 102, including leadframe 110, dies 120 and mold compound 126, as well as partially cover leadframe 130 (step 310).

In some examples, package 100 may be one of an array of packages manufactured on an array of interconnected leadframes 130 within a leadframe strip. In such examples, the method further includes singulating the array of packages to form individual packages 100 (step 312).

FIG. 5 is a flowchart of a method of operating a semiconductor package providing a ground return path within the package. For clarity, the techniques of FIG. 5 are described with respect to IC package 100.

IC package 100 is powered via one or more leads 132 (step 352). For example, the power lead may provide a direct current voltage or alternating current voltage to die 120A and/or die 120B via the powered leads 132 and corresponding leads 112. Next, die 120A is operated to deliver electrical signal 202 to die 120B via conductor 114 on a first layer of IC package 100 (step 354). Signal loop 200 (FIG. 1B) includes the electrical signal 202 on conductor 114, as well as ground return path 204. Ground return path 204 traverses the leads 112 associated with ground contacts of semiconductor dies 120 as well as ground return conductor 134 on a second layer of IC package 100. In this manner, signal loop 200 for electronic signals 202 between semiconductor dies 120 does not require an outside component, such as a ground plane of a PCB on which package 100 is mounted but is instead entirely within package 100. Such an arrangement may limit the impedance of signal loop 200, which may be useful to support high frequency operation of semiconductor dies 120.

Figure 6:
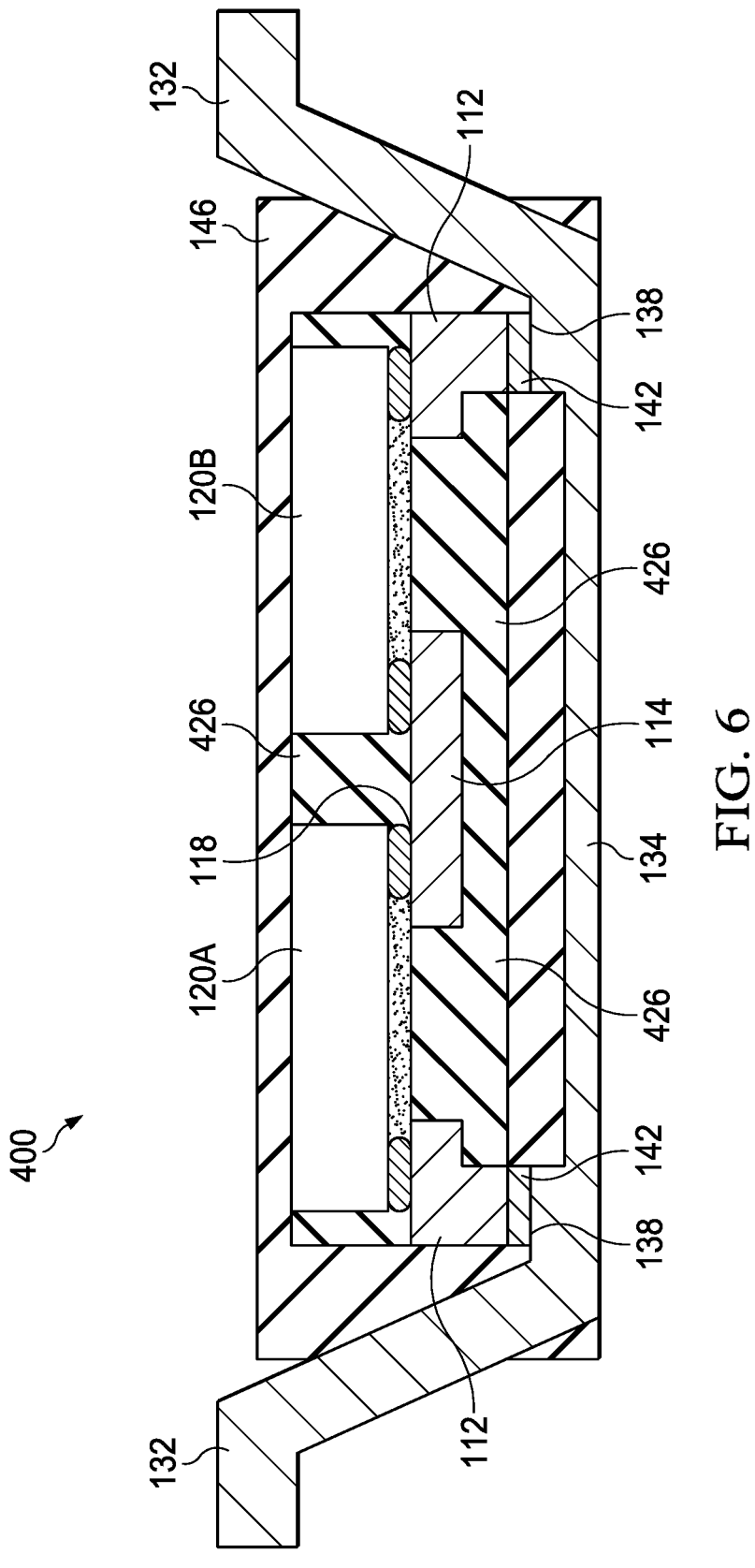
FIG. 6 is a conceptual drawing showing a cut-away side view of a semiconductor package providing a ground return path within the package.

FIG. 6 is a conceptual drawing showing a cut-away side view of IC package 400. IC package 400 is substantially similar to IC package 100 with the exception of mold compound 426 replacing mold compound 126. Elements of IC package 400 with the same numbers as IC package 100 are the same or substantially similar to those elements in IC package 100. For brevity, such elements are described in limited or no detail with respect to IC package 400.

Like IC package 100, IC package 400 includes leadframe 110, dies 120 connected by conductor 114 of leadframe 110. Leadframe 110 is mounted to leadframe 130, which including ground return conductor 134 providing a ground return path for electrical signals between dies 120.

Mold compound 426 covers portions of dies 120 in addition to leadframe 110 such that mold compound 426 is generally flush with surfaces of leads 112 in contact with leadframe 130, and generally flush with surfaces of dies 120 opposite leadframe 110. During manufacturing, molding to cover portions of leadframe 110 with mold compound 426 occurs after securing dies 120 to leadframe 110. The molded assembly of dies 120 and leadframe 110 mounted to leadframe 130, which is then overmolded by mold compound 146.

The specific techniques for packages with dual layer routing including a ground return path described herein, including IC package 100 and IC package 400, are merely illustrative of the general inventive concepts included in this disclosure as defined by the following claims.

What is claimed is:

1. A package comprising:
   a first leadframe including a plurality of leads and a conductor;
   a first semiconductor die mounted on a first surface of the first leadframe and attached to a first subset of the plurality of leads and the conductor;
   a second semiconductor die mounted on the first surface of the first leadframe and attached to a second subset of the plurality of leads and the conductor, the conductor providing a direct electrical connection between the first semiconductor die and the second semiconductor die; and a second leadframe, the first leadframe mounted on the second leadframe via a second surface of the first leadframe, the second surface facing in an opposite direction to the first surface;

wherein the second leadframe includes a first lead electrically coupled to the first semiconductor die, a second lead electrically coupled to the second semiconductor die, and a conductive member connecting the first lead to the second lead and having a thickness less than the first and second leads.

2. The package of claim 1, further comprising a mold compound covering portions of the first leadframe but not the second leadframe.

3. The package of claim 2, wherein the mold compound further covers portions of the first semiconductor die and the second semiconductor die.

4. The package of claim 2, wherein the mold compound forms a first mold, the package further comprising a second mold of the mold compound, the second mold of the mold compound filling space between the first leadframe and the second leadframe and covering the first mold and portions of the second leadframe.

5. The package of claim 4, wherein the second leadframe forms a recess including the first leadframe, the first semiconductor die, and the second semiconductor die that are recessed relative to portions of the second leadframe surrounding the recess, and the second mold of the mold compound further covers the first semiconductor die and the second semiconductor die within the recess.

6. The package of claim 4, wherein the second mold of the mold compound is flush with a surface of the second leadframe opposite the first leadframe, and wherein the surface is exposed on a package surface of the package.

7. The package of claim 1, wherein the first leadframe and the second leadframe are in a stacked arrangement, and a route of the direct electrical connection of the first leadframe overlaps a route of a ground return path between the first semiconductor die and the second semiconductor die provided by the conductive member of the second leadframe.

8. The package of claim 1, wherein the first semiconductor die is mounted on the first surface of the first leadframe in a first flipchip arrangement, and the second semiconductor die is mounted on the first surface of the first leadframe in a second flipchip arrangement.

9. The package of claim 1, wherein the second leadframe forms a recess including the first leadframe, the first semiconductor die, and the second semiconductor die that are recessed relative to portions of the second leadframe surrounding the recess.

10. The package of claim 1, wherein the first semiconductor die is a gallium nitride die.

11. The package of claim 1, wherein the first leadframe is formed from a first sheet of metal and the second leadframe is formed from a second sheet of metal.

12. The package of claim 1, wherein the conductor of the first leadframe is electrically and physically isolated from the plurality of leads of the first leadframe.

13. The package of claim 1, wherein the first semiconductor die is separated from the second semiconductor die by an area therebetween, the conductor extends between a first end of the conductor and a second end of the conductor, the first end of the conductor extends beyond a first side of the area, and the second end of the conductor extends beyond a second side of the area opposite the first side.

14. The package of claim 1, wherein the second leadframe includes a bonding surface that is recessed relative to an outer surface of the second leadframe, the first leadframe mounted to the bonding surface, the bonding surface recessed relative to the outer surface by a first distance, the first and second semiconductor dies disposed within the first distance between the bonding surface and the outer surface.

15. A package comprising:

a first leadframe including a plurality of leads;

a first gallium nitride die mounted on a first surface of the first leadframe and attached to a first subset of the plurality of leads and a conductor;

a second gallium nitride die mounted on the first surface of the first leadframe and attached to a second subset of the plurality of leads and the conductor, the conductor providing a direct electrical connection between the first gallium nitride die and the second gallium nitride die; and a second leadframe, the first leadframe mounted on the second leadframe via a second surface of the first leadframe, the second surface facing in an opposite direction to the first surface, wherein the second leadframe includes a first lead electrically coupled to the first gallium nitride die, a second lead electrically coupled to the second gallium nitride die, and a conductive member connecting the first lead to the second lead and having a thickness less than the first and second leads.

16. The package of claim 13, wherein the conductive member of the second leadframe extends between a first end of the conductive member and a second end of the conductive member, the first end of the conductive member extends beyond the first end of the conductor, and the second end of the conductive member extends beyond the second end of the conductor.

17. The package of claim 16, wherein the conductor is positioned between the first and second semiconductor dies, and the conductor extends in a same direction as the conductive member.

* * * * *